United States Patent [19]

Bugajski et al.

[11] Patent Number: 5,293,164
[45] Date of Patent: * Mar. 8, 1994

[54] DATA COMPRESSION WITH PIPELINE PROCESSOR HAVING SEPARATE MEMORIES

[75] Inventors: Joseph M. Bugajski, Ypsilanti; James T. Russo, Ann Arbor, both of Mich.

[73] Assignee: Triada, Ltd., Ann Arbor, Mich.

[*] Notice: The portion of the term of this patent subsequent to Sep. 14, 2010 has been disclaimed.

[21] Appl. No.: 978,360

[22] Filed: Nov. 18, 1992

Related U.S. Application Data

[63] Continuation of Ser. No. 706,949, May 29, 1991, Pat. No. 5,245,337.

[51] Int. Cl.$^5$ .............................................. H03M 7/30
[52] U.S. Cl. ........................................ 341/51; 341/87
[58] Field of Search ............... 341/51, 87, 95, 106; 364/DIG. 2

[56] References Cited

U.S. PATENT DOCUMENTS 4,064,489 12/1977 Babb ..................................... 364/200
5,023,610 6/1991 Rubow et al. ......................... 341/51

OTHER PUBLICATIONS

Gonzalez-Smith et al., *Parallel Algorithms For Data Compression*, Apr. 1985, Journal of the Association for Computing Machinery, vol. 32, No. 2.

*Primary Examiner*—Howard L. Williams
*Attorney, Agent, or Firm*—Krass & Young

[57] ABSTRACT

The compression system includes a series of pipelined data processors. Each processor has an associated memory. The body of digital data is applied serially to the first processor in the chain. The first processor analyzes pairs of data elements in its incoming signal to detect the occurrence of previously non-occurring sequences and stores those sequences in its associated memory. The output signal from the processor identifies the storage position in its associated memory of each pair of data elements in its input, whether or not those sequences have previously occurred in the data stream. Subsequent processors work with storage location signals only. Each processor provides a single output location signal for each pair of signals in its input. Each processor also determines the number of times that each incoming sequences has occurred and stores that number in association with each stored pair. A hashing table created by each processor and stored in its associated memory is used to segregate the stored pairs into groups having common lower significant figures to simplify the task of determining whether a pair of elements in the input has previously been stored. Pointers stored with each unique pair link the pairs in each hashed sequence in the order of their frequency of occurrence in the incoming data stream so that the incoming elements may be compared with the previously stored elements in the order of probability of occurrence of each pair in the data stream.

5 Claims, 1 Drawing Sheet

DATA COMPRESSION WITH PIPELINE PROCESSOR HAVING SEPARATE MEMORIES

This application is a continuation of Ser. No. 706,949, filed May 29, 1991, now U.S. Pat. No. 5,245,337.

FIELD OF THE INVENTION

This invention relates to digital data conversion systems of the type which convert an input data body into an ordered data structure which is compressed relative to the input body for purposes of storage, transmission, encryption or the like.

DESCRIPTION OF THE PRIOR ART

Methods and apparatus for data compression, or what is sometimes termed "text compression" operate upon bodies of incoming digital data such as alphanumeric text, digitized images, computer code or the like to reduce the memory requirements for storing the data or reduce the time required to transmit the body of data over a communication channel or to encrypt the data for security purposes.

Data compression operates by removing the redundancy in the input data body and the degree of compression that may be achieved is proportional to the redundancy in the data body. Data compression systems may be broadly divided into loss-less systems in which the input data body can be exactly reconstructed from the compressed version or lossy systems often used for digitized analog signals such as speech and images in which a totally reversible reconstruction process is not required. The present invention falls into the class of loss-less systems, sometimes termed reversible or noise-less systems.

Loss-less compression systems may also be divided into statistical encoding in which each symbol is assigned a code based on the probability that it will occur and dictionary compression in which groups of consecutive characters in the input data body are replaced by a code representing the storage location of that sequence in a dictionary. The present invention relates to a compression apparatus and method of the dictionary type.

Dictionary methods of data compression may in turn be divided into static dictionary arrangements which contain a fixed dictionary based upon a priori knowledge of the general nature of the input data body. For example, if the data body is English text, the dictionary might be based on statistical occurrence of data sequences in that text. The alternative approach is a dynamic or adaptive dictionary encoder which utilizes the initial sections of an input data body to construct a dictionary which is modified as more of the data body is processed. The present invention relates to such a dynamic dictionary compression system.

Within the field of loss-less dynamic dictionary compression, an arrangement termed ZIV-LEMPEL compression has been regarded as highly efficient. Variations on the ZIV-LEMPEL method are disclosed in U.S. Pat. No. 4,464,650 to Eastman et al; U.S. Pat. No. 4,558,302 to Welch; and U.S. Pat. No. 4,906,991 to Fiala et al.

These ZIV-LEMPEL processors broadly accept the data body to be encoded as an input serial stream and create a dictionary which stores initial segments of the data stream. Subsequently occurring segments are compared to the stored segments to generate a code word which points to one end of the prior occurrence of the string in the memory, identifies the length of that string which is identical to the incoming segment, and includes the next unique character in the incoming segment.

A broad overview of the field of data compression is contained in *Modeling for Text Compression*, Bell et al., ACM Computing Surveys, vol. 21, no. 4, December 1989.

SUMMARY OF THE INVENTION

The present invention is directed toward a method and apparatus for implementing a loss-less dynamic dictionary compression scheme which has improved compression efficiency, speed and simplicity relative to these prior art techniques, at least with respect to certain classes of data.

The data structure created by the method of the present invention employs an associative principle which may be analogized to the operation of the memory function of the human brain. The first time the brain receives a set of sensory inputs which it regards as suitable for permanent recording, such as inputs representing an image of a face, the melody of a popular tune or the content of a lesson, for example, the brain records an association of those sensory signals. When the same set of sensory inputs are again generated, as by again seeing the face, hearing the song or experiencing the lesson, the brain makes a correlation between the earlier memorized association and the new input and recognizes the new input as constituting a repeat of the old image. The brain does not store these repetitive occurrences of the same set of sensory input, but rather reinforces the association it has already learned.

Likewise, the machine of the invention is an associative data storage machine. It stores information as associations. An association is the memory of the occurrence of a set of events. A subsequent occurrence of an identical set of events does not cause a new memory, but reinforces the association already in memory. Once the machine has learned certain sets of events, they are available for comparison with sets occurring later in the input data stream and when an association is recognized it is unnecessary to learn the new section but it is sufficient to merely identify the new section as being equal to the previously learned section. This associative factor results in the stored data structure involving less memory than would be required to store the full input data stream.

The structure of the machine is a hierarchy of processes hereafter referred to as levels. Each level must implement a function which will generate a single output value for every set of input values. The function must be reversible, that is for every output value it must be able to operate in reverse, to reproduce the single and unique set of input values. It is not necessary that every level of the machine use the same function, provided each function is mathematically reversible.

One such function would be to consider the input values as fixed-length binary numbers, and to merely concatenate a pair of numbers to produce a fixed-length binary number with twice the length (twice as many bits.) The reverse of this function is to split the long binary number into two shorter numbers. This is the simplest function that meets the requirements. It is not a very useful one since the number of bits in a number would double at every level.

Another class of functions that can be used are ones that make use of local storage within the level to record some information about the input values which have actually been processed by that level.

A simple function of this type is one which keeps in its local storage a copy of every unique pair of input values which has been presented to it. The address of the local memory which contains a copy of the input pair is used as the output value. When an input pair is encountered that is the same as a pair that was previously processed, no new local storage is used, and the address of the local memory that already contains values matching the input values is used again as the output value. This function, with a few improvements to optimize the speed of comparing the new input to the associations already learned, is the basis for the preferred embodiment of the invention.

Broadly, the method of the present invention involves analyzing the incoming data stream in serial fashion, by parsing the stream into short sequences of data elements, preferably pairs, and generating an output stream consisting of signals representative of each of the successive sequences of the input data. This output stream is provided to a second process or level which operates on the output signal of the first process in the same manner that the first process operated on the incoming data stream. The output of the second level is provided to a third level, and this is repeated through a finite number of levels.

The output signal from each level contains fewer data elements than the incoming signal so that successively higher levels operate at lower rates since each level must await processing of a plurality of input data elements by the proceeding level before it receives a single data element from the next lower level.

Broadly, the preferred method of the present invention may be viewed as the repetitive application of the algorithm of detecting the previously non-occurring sequences of data in an input data stream, storing such previously non-occurring sequences and generating an output signal representative of the position of storage of each incoming sequence in the storage means with the output signal having fewer data elements than the incoming sequence.

The incoming data stream may readily be reconstructed from this memory structure by reversing the process and feeding down stored data elements from higher levels to lower levels to cause the regeneration of the input data stream in the same way that it was dissected in the learning process.

The apparatus for implementing the method of the present invention could comprise a general purpose computer, but preferably consists of a special purpose system employing separate processors connected in a serial chain by bi-directional communication links, so that each processor in the chain receives the output of the sequentially lower processor during the storage cycle in which the data structure is constructed and receives the output of the sequentially higher processor in the chain during reconstruction of the incoming data body. Each processor preferably has its own memory of a size tailored to its position in the chain. The preferred embodiment of the invention also incorporates a serial memory to receive outputs from the highest level processor in the chain during data storage.

In the preferred embodiment of the invention, in which each pair of inputs to a processor result in a single output during the data storage process, the occurrence of a unique pair at the input will cause the processor to store a four word entry in memory. Two of the words constitute the unique pair, the third word is a count of how many times that pair has occurred in the input data and the fourth word is a link pointer representing the address of another entry in that memory which has occurred less frequently in the input.

Each processor also performs a hashing function to assign each pair of numbers from the input to one of a plurality of linked lists. In the preferred embodiment of the invention the hashing function operates to divide all input pairs into one of the lists by generating the sum of a predetermined number of least significant bits of the two numbers in each input pair and assigning all pairs with the same sum to the same list. The processor also constructs a hashing index table containing a pointer to the most frequently occurred entry in each of the linked lists. This arrangement is used to economize the task of determining whether an input pair has previously occurred. After summing the least significant bits of that input pair to determine which of the linked lists it should be compared to, the hashing table is then used to determine the memory location of the pair of that linked list which has occurred most frequently and comparison is made between the input pair and each of the sequentially less frequent stored input pairs in that linked list to determine the uniqueness of the input pair.

An alternative embodiment of the invention provides a way to continue to process new input records even after all of the available memory in a level has been filled up. In this alternative embodiment, after an initial learning period during which all unique data pairs in the input to a level result in entries in the data structure, a second mode of operation is begun. In this second mode, when a unique pair is detected, a null signal is outputted to the next highest process, and the unique data pair is added as an appendage to the output signal from that processor and is passed upwardly through the higher level processors to the serial memory which receives the output of the highest processor in the system. The appendages from all levels are stored with the output from the highest level. When a record is reconstructed, the appendages are passed back down so that any nulls in a reconstructed record can be replaced by the appropriate unique data pair. This arrangement allows the system to process an unlimited number of input records and to reversibly reconstruct the records.

Another alternative embodiment of the invention reserves part of the memory in a level for data pairs which do not occur during the first mode of operation, but which occur at a relatively high frequency once they have begun to occur during the second mode of operation. This is done by dividing the memory associated with each processor into two sections, one termed permanent and the other termed temporary. During the first mode of operation, each input to the processor which has not previously occurred in the input stream is stored in the permanent memory section. After an initial learning period during which all entries in the data structure are made in the permanent section, a second mode of operation is begun. In this second mode, when a unique pair is detected, it is loaded into the temporary memory section, a null signal is outputted to the next highest process, and the unique data pair is added as an appendage to the output signal from that processor and is passed upwardly through the higher level processors to the serial memory which receives the output of the highest processor in the system. The appendages from all levels are stored with the output from the highest level. When a record is reconstructed, the appendages are passed back down so that any nulls in a reconstructed record can be replaced by the appropriate unique data pair. When an entry in the temporary section has occurred a predetermined number of times in the input signal it is promoted to permanent memory and treated in the normal manner. This arrangement allows the system to process input records of unlimited length and to reversibly reconstruct the records.

Other objectives, advantages and applications of the present invention will be made apparent by the following detailed description of the preferred embodiments of the invention. The description makes reference to the accompanying drawing in which:

DETAILED DESCRIPTION OF THE PREFERRED EMBODIMENTS

Figure 1:
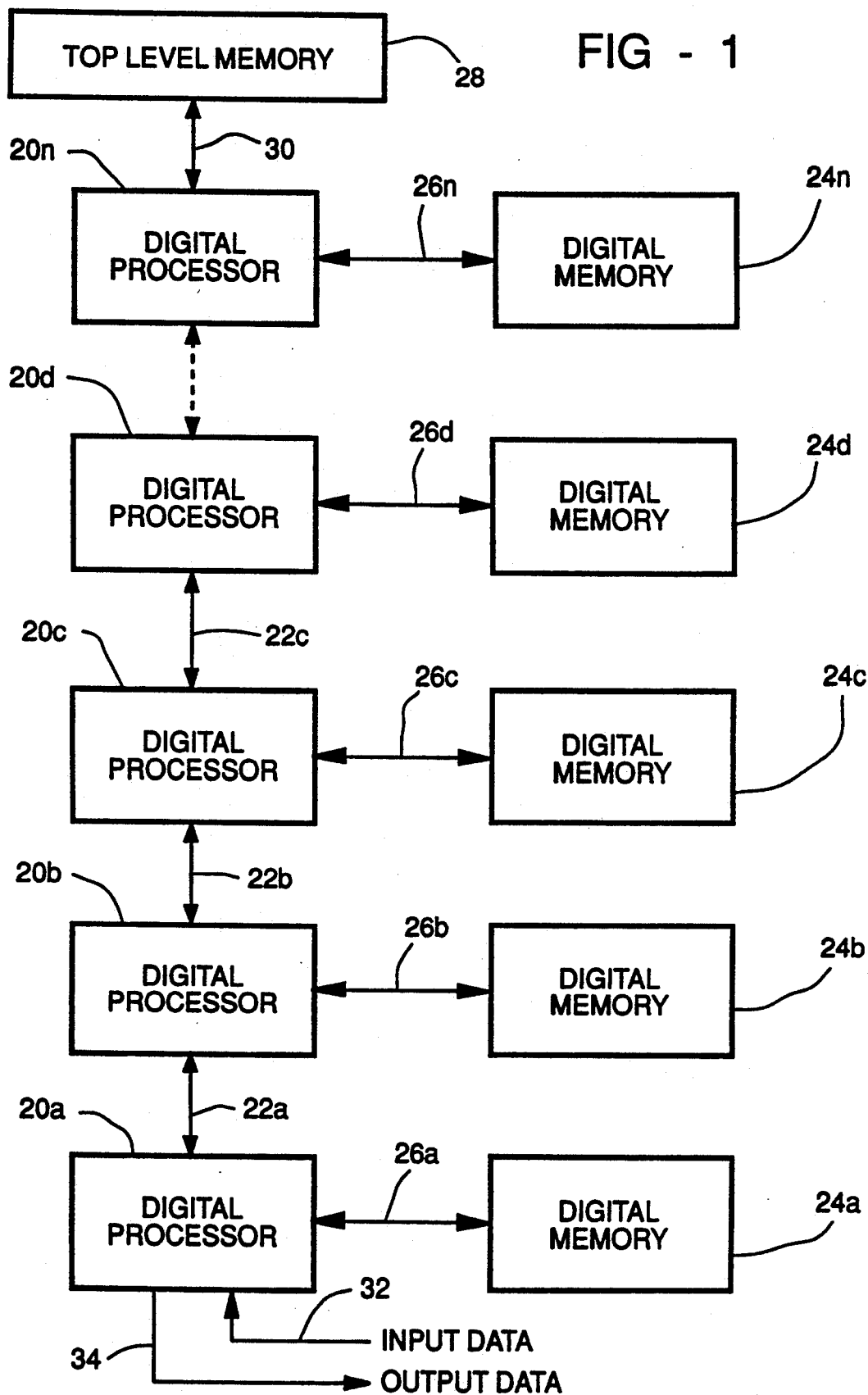
FIG. 1 is a schematic diagram of a machine representing the preferred embodiment of the apparatus of the present invention.

The methods of the present invention are preferably performed by digital processors which may take a wide variety of forms. At one extreme the method of the present invention could be implemented by a general purpose Von Neumann computer but for the large bodies of data for which the present invention exhibits its highest efficiency in terms of data compression, general purpose computer implementation would be very slow for both the data storage and the reconstruction tasks. Accordingly, the preferred embodiments of the apparatus of the present invention take the form of special purpose computers having the form illustrated in FIG. 1.

The machine consists of a chain of digital processors $20a, 20b, 20c, 20d \ldots 20n$. The processors are interconnected to one another by bidirectional data paths $22a, 22b, 22c$, et cetera. Each processor is interconnected to an associated digital memory $24a, 24b, 24c, 24d \ldots 24n$. The interconnection between each processor and its associated memory is through a bidirectional connection $26a, 26b, 26c, 26d \ldots 26n$. The last processor in the chain, $20n$ is connected to serial memory 28 by a bidirectional data path 30.

The processor $20a$ and its associated memory $24a$ at one end of the chain will hereafter be sometimes termed the lowest level in the system and the processor $20n$ and its associated memory $24n$ will be termed the highest level. Input data to be processed by the machine in order to generate an ordered data structure in the memories $24a-n$ is provided to the lowest level processor $20a$ through an input channel 32. The reconstructed output of the data structure, which is identical in form to the earlier input data stream on line 32 is provided from the lowest level process $20a$ on an output channel 34.

In the simplest embodiment of the invention, processor $20a$ examines each pair of input signals which may take the form of alphanumeric data encoded in ASCII form, to determine if that particular sequence of symbols has previously occurred in the input data. If it has not previously occurred, or is unique, the pair is stored in the memory $24a$. The content of the memory $24a$ is used by the processor $20a$ to determine whether a pair of symbols in the input stream is unique. The processor $20a$ then provides output on line $22a$, to processor $20b$ which repeats exactly the same process as did processor $20a$, treating the signals on line $22a$ as input. This processing algorithm is repeated by each of the processors. It can thus be seen that each processor outputs a single digital word for each pair of digital words it receives and the only storage which occurs is that of the input pairs which are unique at that level.

To understand the operation of the system, consider the machine of FIG. 1 to be initially empty and to receive the text string "JOHN J. JONES HAS JOINED JOHNSON AND JOHNSON AS A JUNIOR JANITOR". The example will show the operation through six levels. In the listing below, spaces are shown as—to make them visible.

Processor $20a$ processes this text two characters at a time.

| Input Pair on Line 32 | Stored in Local Memory 24a | | Output Data to Processor 20b |
|---|---|---|---|
| | Address | Content | |
| JO | 1 | JO | 1 |
| HN | 2 | HN | 2 |
| —J | 3 | —J | 3 |
| .— | 4 | .— | 4 |
| JO | | | 1 |
| NE | 5 | NE | 5 |
| S— | 6 | S— | 6 |
| HA | 7 | HA | 7 |
| S— | | | 6 |
| JO | | | 1 |
| IN | 8 | IN | 8 |
| ED | 9 | ED | 9 |
| —J | | | 3 |
| OH | 10 | OH | 10 |
| NS | 11 | NS | 11 |
| ON | 12 | ON | 12 |
| —A | 13 | —A | 13 |
| ND | 14 | ND | 14 |
| —J | | | 3 |
| OH | | | 10 |
| NS | | | 11 |
| ON | | | 12 |
| —A | | | 13 |
| S— | | | 6 |
| A— | 15 | A— | 15 |
| JU | 16 | JU | 16 |
| NI | 17 | NI | 17 |
| OR | 18 | OR | 18 |
| —J | | | 3 |
| AN | 19 | AN | 19 |
| IT | 20 | IT | 20 |
| OR | | | 18 |

Level 2, consisting of processor $20b$ and memory $24b$ processes the output from level 1 two numbers at a time.

| Input Pair on Line 22a | | Stored in Local Memory 24b | | Output Data to Processor 20c |
|---|---|---|---|---|
| | | Address | Content | |
| 1 | 2 | 1 | 1 | 2 | 1 |
| 3 | 4 | 2 | 3 | 4 | 2 |
| 1 | 5 | 3 | 1 | 5 | 3 |
| 6 | 7 | 4 | 6 | 7 | 4 |
| 6 | 1 | 5 | 6 | 1 | 5 |
| 8 | 9 | 6 | 8 | 9 | 6 |
| 3 | 10 | 7 | 3 | 10 | 7 |
| 11 | 12 | 8 | 11 | 12 | 8 |
| 13 | 14 | 9 | 13 | 14 | 9 |
| 3 | 10 | | | | 7 |
| 11 | 12 | | | | 8 |
| 13 | 6 | 10 | 13 | 6 | 10 |
| 15 | 16 | 11 | 15 | 16 | 11 |
| 17 | 18 | 12 | 17 | 18 | 12 |
| 3 | 19 | 13 | 3 | 19 | 13 |

-continued

| Input Pair on Line 22a | Stored in Local Memory 24b | | Output Data to Processor 20c |
|---|---|---|---|
| | Address | Content | |
| 20  18 | 14 | 20  18 | 14 |

Level 3, consisting of processor 20c and memory 24c processes the output from level 2 two numbers at a time.

| Input Pair on Line 22b | Stored in Local Memory 24c | | Output Data to Processor 20d |
|---|---|---|---|
| | Address | Content | |
| 1  2 | 1 | 1  2 | 1 |
| 3  4 | 2 | 3  4 | 2 |
| 5  6 | 3 | 1  5 | 3 |
| 7  8 | 4 | 6  1 | 4 |
| 9  7 | 5 | 7  8 | 5 |
| 8  10 | 6 | 3  9 | 6 |
| 11  12 | 7 | 10  11 | 7 |
| 13  14 | 8 | 12  13 | 8 |

Level 4, consisting of processor 20d and memory 24d processes the output from level 3 two numbers at a time.

| Input Pair on Line 22c | Stored in Local Memory 24d | | Output Data to Processor 20e |
|---|---|---|---|
| | Address | Content | |
| 1  2 | 1 | 1  2 | 1 |
| 3  4 | 2 | 3  4 | 2 |
| 5  6 | 3 | 5  6 | 3 |
| 7  8 | 4 | 7  8 | 4 |

Level 5, consisting of processor 20e and memory 24e processes the output level 4 two numbers at a time.

| Input Pair on Line 22d | Stored in Local Memory 24e | | Output Data to Processor 20f |
|---|---|---|---|
| | Address | Content | |
| 1  2 | 1 | 1  2 | 1 |
| 3  4 | 2 | 3  4 | 2 |

Level 6, consisting of processor 20f and memory 24f processes the output from level 5 two numbers at a time.

| Input Pair on Line 22e | Stored in Local Memory 24f | | Output Data to Serial Memory 28 |
|---|---|---|---|
| | Address | Content | |
| 1  2 | 1 | 1  2 | 1 |

It may be noted that the initial input data presented to this machine results in a large amount of local storage. Initially most input pairs at every level are being seen for the first time. As more and more data is processed, occurrences of input pairs that match ones already in the local storage will become more frequent, and the occurrences of new things which need to be stored will become less frequent.

In the next part of the example, data storage will continue with the next string "JOHN J. JONES OF JOHNSON AND JOHNSON DOES NOT LIKE HIS JOB NOW. JOHN J. JONES WILL QUIT JOHNSON AND JOHNSON AND SEEK A NEW JOB." Level 1 again processes this text 2 characters at a time. In the listing below, spaces are shown as - to make them visible.

| Input Pair | Stored in Local Memory | | Output Data |
|---|---|---|---|
| | Address | Content | |
| JO | | | 1 |
| HN | | | 2 |
| —J | | | 3 |
| .— | | | 4 |
| JO | | | 1 |
| NE | | | 5 |
| S— | | | 6 |
| OF | 21 | OF | 21 |
| —J | | | 3 |
| OH | | | 10 |
| NS | | | 11 |
| ON | | | 12 |
| —A | | | 13 |
| ND | | | 14 |
| —J | | | 3 |
| OH | | | 10 |
| NS | | | 11 |
| ON | | | 12 |
| —D | 22 | —D | 22 |
| OE | 23 | OE | 23 |
| S— | | | 6 |
| NO | 24 | NO | 24 |
| T— | 25 | T— | 25 |
| LI | 26 | LI | 26 |
| KE | 27 | KE | 27 |
| —H | 28 | —H | 28 |
| IS | 29 | IS | 29 |
| —J | | | 3 |
| OB | 30 | OB | 30 |
| —N | 31 | —N | 31 |
| OW | 32 | OW | 32 |
| .— | | | 4 |
| JO | | | 1 |
| HN | | | 2 |
| —J | | | 3 |
| .13 | | | 4 |
| JO | | | 1 |
| NE | | | 5 |
| S— | | | 6 |
| WI | 33 | WI | 33 |
| LLO | 34 | LL | 34 |
| —Q | 35 | —Q | 35 |
| UI | 36 | UI | 36 |
| T— | | | 25 |
| JO | | | 1 |
| HN | | | 2 |
| SO | 37 | SO | 37 |
| N— | 38 | N— | 38 |
| AN | | | 19 |
| D— | 39 | D— | 39 |
| JO | | | 1 |
| HN | | | 2 |
| SO | | | 37 |
| N— | | | 38 |
| AN | | | 19 |
| D— | | | 39 |
| SE | 40 | SE | 40 |
| EK | 41 | EK | 41 |
| —A | | | 13 |
| —N | | | 31 |
| EW | 42 | EW | 42 |
| —J | | | 3 |
| OB | | | 30 |
| .— | | | 4 |

Level 2 processes the output from level 1 two numbers at a time.

| Input Pair | Stored in Local Memory | | Output Data |
|---|---|---|---|
| | Address | Content | |
| 1  2 | | | 1 |
| 3  4 | | | 2 |
| 1  5 | | | 3 |
| 6  21 | 15 | 6  21 | 15 |
| 3  10 | | | 7 |
| 11  12 | | | 8 |

-continued

| Input Pair | | Stored in Local Memory | | Output Data |
|---|---|---|---|---|
| | | Address | Content | |
| 13 | 14 | | | 9 |
| 3 | 10 | | | 7 |
| 11 | 12 | | | 8 |
| 22 | 23 | 16 | 22 23 | 16 |
| 6 | 24 | 17 | 6 24 | 17 |
| 25 | 26 | 18 | 25 26 | 18 |
| 27 | 28 | 19 | 27 28 | 19 |
| 29 | 3 | 20 | 29 3 | 20 |
| 30 | 31 | 21 | 30 31 | 21 |
| 32 | 4 | 22 | 32 4 | 22 |
| 1 | 2 | | | 1 |
| 3 | 4 | | | 2 |
| 1 | 5 | | | 3 |
| 6 | 33 | 23 | 6 33 | 23 |
| 34 | 35 | 24 | 34 35 | 24 |
| 36 | 25 | 25 | 36 25 | 25 |
| 1 | 2 | | | 1 |
| 37 | 38 | 26 | 37 38 | 26 |
| 19 | 39 | 27 | 19 39 | 27 |
| 1 | 2 | | | 1 |
| 37 | 38 | | | 26 |
| 19 | 39 | | | 27 |
| 40 | 41 | 28 | 40 41 | 28 |
| 13 | 31 | 29 | 13 31 | 29 |
| 42 | 3 | 30 | 42 3 | 30 |
| 30 | 4 | 31 | 30 4 | 31 |

Level 3 processes the output from level 2 two numbers at a time.

| Input Pair | | Stored in Local Memory | | Output Data |
|---|---|---|---|---|
| | | Address | Content | |
| 1 | 2 | | | 1 |
| 3 | 15 | 9 | 3 15 | 9 |
| 7 | 8 | | | 4 |
| 9 | 7 | | | 5 |
| 8 | 16 | 10 | 8 16 | 10 |
| 17 | 18 | 11 | 17 18 | 11 |
| 19 | 20 | 12 | 19 20 | 12 |
| 21 | 22 | 13 | 21 22 | 13 |
| 1 | 2 | | | 1 |
| 3 | 23 | 14 | 3 23 | 14 |
| 24 | 25 | 15 | 24 25 | 15 |
| 1 | 26 | 16 | 1 26 | 16 |
| 27 | 1 | 17 | 27 1 | 17 |
| 26 | 27 | 18 | 26 27 | 18 |
| 28 | 29 | 19 | 28 29 | 19 |
| 30 | 31 | 20 | 30 31 | 20 |

Level 4 processes the output from level 3 two numbers at a time.

| Input Pair | | Stored in Local Memory | | Output Data |
|---|---|---|---|---|
| | | Address | Content | |
| 1 | 9 | 5 | 1 9 | 5 |
| 4 | 5 | 6 | 4 5 | 6 |
| 10 | 11 | 7 | 10 11 | 7 |
| 12 | 13 | 8 | 12 13 | 8 |
| 1 | 14 | 9 | 1 14 | 9 |
| 15 | 16 | 10 | 15 16 | 10 |
| 17 | 18 | 11 | 17 18 | 11 |
| 19 | 20 | 12 | 19 20 | 12 |

Level 5 processes the output from level 4 two numbers at a time.

| 5 | 6 | 3 | 5 6 | 3 |
| 7 | 8 | 4 | 7 8 | 4 |
| 9 | 10 | 5 | 9 10 | 5 |
| 11 | 12 | 6 | 11 12 | 6 |

Level 6 processes the output from level 5 two numbers at a time.

| 3 | 4 | 2 | 3 4 | 2 |
| 5 | 6 | 3 | 5 6 | 3 |

Notice that in the second example, levels 1 and 2 needed to store new pairs in the local memory at about half the rat that they did in the first example. Even level 3 processed a few pairs which did not use new memory. As more and more data is processed, this phenomena will continue. New pairs will happen less and less often. Even higher levels will begin to find pairs which do not require new memory.

Data may be constructed by operating the system in the reverse direction. Any number which is stored in Serial Memory 28 may be passed back down through the levels. In the example above, when processor 20f receives the number 2, it takes the contents of entry address 2, which is the pair of numbers 3 and 4, and sends them through path 22e to processor 20e. Processor 20e responds by sending the contents of its addresses 3 and 4 to the level below, etc. At the lowest level, processor 20a will send the reconstructed group of characters to output channel 34.

When large enough amounts of data have been stored in the machine, the distribution of frequencies of events will show certain characteristics. A small number of high-frequency number pairs will account for a large proportion of input data seen by a level. A large number of low-frequency number pairs, which can occupy a large part of the local storage, will represent only a small part of the input data. Knowledge of this expectation of distribution of frequencies can be used to plan an associative function and an allocation of local storage to optimize the speed of the storage and retrieval functions and to set practical limits on the amount of local storage required in each level of the machine.

Since low-frequency input number pairs use up local storage at a rate out of proportion to the portion of the input that they represent, the preferred mode of the invention includes a way to limit the space that low-frequency number pairs use up in local storage by passing them along as an appendage to the output. This has the effect of increasing the size of the output in a way that is related to the amount of new information in the input.

In the preferred mode of the machine of the present invention, each level consists of an INMOS T800 transputer with a large dynamic ram memory, and a copy of the operating software. The T800 has a 32-bit address space which can directly address up to 4 GigaBytes of memory. Each level is connected by a serial communications link to the level above it, and by another serial communications link to the level below it. The top and bottom levels are connected to the Input/Output interfaces.

The operation of each level is the same as that of the other levels except that the record size is successively smaller at each higher level. Record size is the amount of data which results in the output of one address value from the highest level during data storage. This same record size will apply to the output generated by each level during the reconstruction process resulting from one address value presented to the highest level.

The data that is stored in the local storage consists of unique pairs of numbers that have been part of the input data stream along with counts of the number of occurrences of each pair and pointers to connect these items into linked lists. A fixed number of logically separate linked lists are used. A linked list is a data structure that allows a list to have a logical order that is not the same as its physical order. A linked list can be accessed sequentially, since each element contains a pointer to the next.

A hashing function is used to assign each pair of numbers from the input to one of the linked lists. A hashing function maps a large number of items (in this case, the pairs of input numbers) onto a smaller number of values (in this case, an index into the hashing index table). The hashing function used in the preferred embodiment is to take the 16 least significant bits of the sum of the two numbers in the input pair.

The hashing index table is a fixed length table which contains a pointer to the logically first.-.entry in each of the linked lists. In the preferred embodiment, the hashing index table contains 65536 addresses, each of which is the 32-bit address of the logically first entry of the corresponding linked list.

An entry is 4 words long. The first 2 words are a pair of numbers which have occurred in the input data at least once. The next word is the link pointer, that is, the address of another entry that is part of the same linked list. The fourth word is a count of how many times the pair has been seen in input data.

The linked lists are maintained in such a way that the entries which have occurred most often are at the beginning of the list, and the ones which have occurred least often are at the end.

Each linked-list starts with a pointer contained in the hashing index table. This pointer is the address of an entry in memory (if the list has any entries), or the default value indicating the end of the list.

When an input record is presented to a level for storage, the following procedure is followed. The processor takes a pair of input numbers, starting from the beginning of the record, and uses the hashing function to determine the appropriate entry in the hashing index table, and then looks through the indicated linked list until it finds a matching pair of numbers or reaches the end of the list.

While searching through a linked list, the processor keeps track of a few pieces of information which may be needed when the list is updated after the search. Since there are no backwards pointers, it keeps a pointer to the entry before the one it is currently looking at (hereafter called the first previous entry) and to the link pointer before that (the second previous link pointer).

If no match was found, then the new item is added to the list in the following way. The link pointer of the last entry in the list is set to point to the next available space in the unused memory, and a new entry is made there using the input number pair, a count of one, and the default pointer value indicating the end of the list. The address of the new entry is placed into the output record.

If a match is found, the address of that entry is placed into the output record, and the count for the entry is incremented. If the count then exceeds the count of the first previous entry by more than a predetermined threshold for relinking, then the entry is moved up in the logical sequence of the list. This is done by rewriting the link pointers in this and the two previous entries. The address that was in the link pointer of the current entry is copied to the link pointer in the first previous entry. The address of the first previous entry is written in the link pointer of the current entry. The address of the current entry is written in the second previous link pointer.

After an input pair has been processed, the next pair from the same input record is taken and processed in the same way.

When the available memory on a level has been filled up, then no more data pairs can be stored in it. An input pair which does not match any of the existing pairs can no longer be added to the structure. When such a non-matching input pair is encountered during the storage of a new input record, a null value is written to the output record instead of an address, and the data pair is included as an appendage at the end of the output record. Any such appendage which is received along with the input record is also added to the end of the output record, so that the appendages from all the levels are included with the output from the highest level.

In the alternative embodiment of the invention which reserves part of the memory in a level for data pairs which do not begin to occur until the structure is relatively full, the memory is treated as two heaps which are built up from opposite ends of the address space. One is called permanent memory. The other is called temporary memory. During the initial mode of operation of each level, all new entries are made in permanent memory. When a predetermined portion of memory has been filled, the second mode of operation is begun during which temporary memory is used for new entries.

The entries in the temporary heap have the same structure, but are not maintained in the same way as entries in permanent memory. Temporary entries hold pairs of numbers which have occurred in the input to this level, but not yet often enough to have been placed in permanent memory. Some temporary entries may be empty, that is they can hold default values which indicate that the location does not presently hold a valid number pair.

Each linked-list starts with a pointer contained in the hashing index table. This pointer is the address of an entry in permanent memory (if the list has any permanent entries), or the address of the pre-assigned first temporary entry for the list. If there are permanent entries, each of them points to another permanent entry except the last one which points to the preassigned first temporary entry. There may be additional temporary entries. Each temporary entry points to the next, except the last one which has a default value in its pointer indicating the end of the list.

While searching through a linked list, the processor keeps track of a few pieces of information which may be needed when the list is updated after the search. Since there are no backwards pointers, it keeps a pointer to the entry before the one it is currently looking at (hereafter called the first previous entry) and to the link pointer before that (the second previous link pointer). When it gets to the end of a linked list in permanent memory, it keeps a pointer to the last link pointer in permanent memory. If there were no permanent entries in the list, then the location in the hashing index table is considered to be the last link pointer in permanent memory. After searching through the permanent part of a linked list, it then searches the corresponding temporary list, beginning with the pre-assigned first temporary entry for that list. If it finds any empty temporary entries in the list, it keeps a pointer to the first empty temporary entry.

If no match was found, then the output value indicating an occurrence of a low-frequency input pair is placed into the output record, the input pair is copied into a buffer for low-frequency appendages, and the new item is added to the list in the following way. If an empty temporary entry was found, the number pair is stored in it, and the counter is initialized to one. If no empty temporary entry was found, then the link pointer of the last entry in the list is set to point to the next available space on the temporary heap, and a new entry is made there using the input number pair, a count of one, and the default pointer value indicating the end of the list.

If a match is found in the permanent area, the address of that entry is placed into the output record, and the count for the entry is incremented. If the count then exceeds the count of the first previous entry by more than a predetermined threshold for re-linking, then the entry is moved up in the logical sequence of the list. This is done by rewriting the link pointers in this and the two previous entries. The address that was in the link pointer of the current entry is copied to the link pointer in the first previous entry. The address of the first previous entry is written in the link pointer of the current entry. The address of the current entry is written in the second previous link pointer.

If a match is found in the temporary area, then the count for the entry is incremented. If the count then exceeds the predetermined threshold for creating permanent memories then the entry is transferred to permanent memory. This is done by making an entry using the next available space in permanent memory. The input number pair and the count are copied to the new entry. The current entry in temporary memory is made empty by writing the default value for an empty temporary entry into it. The address held in the last link pointer in permanent memory is copied to the new entry, and the address of the new entry is written into that link pointer (which was the last link pointer in permanent memory). The address of the new permanent entry is placed into the output record. If the count does not exceed the threshold, then the output value indicating an occurrence of a low-frequency input pair is placed into the output record, and the input pair is copied into a buffer for low-frequency appendages.

Whenever there is no room left for additional temporary or permanent entries, all temporary entries are discarded. This is done by marking the pre-assigned first temporary entry for each list as empty and as the last entry in its list.

After an input pair has been processed, the next pair from the same input record is taken and processed in the same way. At the end of the fixed-length part of the input record, there may be an appendage of low-frequency numbers from the levels below. This appendage is then copied to the output, followed by the contents of this level's buffer for low-frequency appendages.

Having thus described our invention, we claim:

1. The method of operating upon an incoming data stream to generate an ordered body of data from which the incoming data stream may be reconstructed, comprising the steps of:
   providing a plurality of sequentially ordered memory levels and a plurality of processing means, each processing means being associated with one of said memory levels;
   at the processor means associated with the first memory level:
   receiving said incoming data stream;
   analyzing said stream to detect the occurrence of previously non-occurring sequences of data elements in said stream;
   storing said non-occurring sequences in said first memory level; and
   outputting a signal representative of the storage location in said first memory level for each sequence of data elements in said incoming stream;
   at the processing means associated with each sequential memory level;
   receiving an output signal from the processing means associated with the sequentially lower memory level;
   analyzing said output to detect the occurrence of previously non-occurring sequences of storage location elements occurring in said output signal;
   storing said non-occurring sequences; and
   outputting to the processing means associated with the next higher memory level signals representative of the storage location in its associated memory level of each sequence of storage location elements in its incoming signal.

2. The memory of claim 1 wherein the step of detecting previous non-occurring sequences includes detecting pairs of elements.

3. The method of claim 1 including the step of recording, at each memory level, the number of occurrences in its signal of each storage input sequence.

4. The method of receiving an incoming data stream and converting the data stream into an ordered storage array from which the incoming data stream may be reconstructed, comprising the steps of:
   providing an ordered sequence of memory levels and a plurality of processing means, each being associated with a different memory level;
   receiving at each processing means input signals from a processing means associated with a lower memory level;
   storing at each memory level certain sequences of elements detected in its input signal;
   generating output signals to the processing element associated with each sequentially higher memory level using a reversible algorithm which converts a plurality of sequential elements in its input stream into a signal element in its output signal;
   and, at each processing means other than the processing means associated with the first level:
   detecting and storing in its associated memory only previously non-occurring sequences of storage elements occurring in its input stream, so that each memory level stores a unique sequence of incoming elements in only a single location.

5. The method of receiving an incoming digital data stream and converting it into an ordered structure of entries in a digital memory from which the incoming data stream may be reconstructed, comprising the steps of:
   providing a plurality of sequentially ordered means for analyzing incoming sequences of elements in said input stream;
   storing at least certain previously non-occurring sequences of such elements as entries in said digital memory;
   generating an output signal representative of the storage location in said digital memory of at least certain incoming sequences of elements, the output signals for each means in the plurality having fewer elements than the incoming sequence;
   wherein the first such means for analyzing in the order receiving said incoming data stream as its incoming sequence and the subsequent such means for analyzing receiving the output signals from a lower such means in the order representing storage locations and providing their output, representing only storage locations, signals to higher such means in the order.

* * * * *